United States Patent
Okazaki

[11] Patent Number: 5,670,797
[45] Date of Patent: Sep. 23, 1997

[54] COMPACT LIGHT-EMITTING DEVICE WITH SEALING MEMBER AND LIGHT-TRANSMITTING RESIN SEAL

[75] Inventor: Jun Okazaki, Nara, Japan

[73] Assignee: Sharp Kabushiki Kaisha, Osaka, Japan

[21] Appl. No.: 566,134

[22] Filed: Dec. 1, 1995

[30] Foreign Application Priority Data

Dec. 6, 1994 [JP] Japan .............................. 6-302329
Jun. 8, 1995 [JP] Japan .............................. 7-142202

[51] Int. Cl.⁶ ............................................. H01L 33/00
[52] U.S. Cl. ........................... 257/91; 257/98; 257/99; 257/100; 257/669
[58] Field of Search ........................ 257/88, 91, 98, 257/99, 100, 676, 669, 698

[56] References Cited

U.S. PATENT DOCUMENTS 5,475,241 12/1995 Harrah et al. ........................ 257/99

FOREIGN PATENT DOCUMENTS 05 88 040 A2 3/1994 European Pat. Off.
31 28 187 A1 2/1983 Germany.
56-44591 10/1981 Japan .................................. 257/99
58-30744 7/1983 Japan .................................. 257/99
4-102378 4/1992 Japan .................................. 257/99
7-283439 10/1995 Japan .................................. 257/99

*Primary Examiner*—Minh-Loan Tran
*Attorney, Agent, or Firm*—Nixon & Vanderhye P.C.

[57] ABSTRACT

On an insulating substrate through which a plurality of through holes are formed, the following components and members are provided: LED chips, each of which consists of a p-side semiconductor layer and an n-side semiconductor layer that are joined into a p-n junction, and is placed between the adjacent through holes; a first electrode which is formed in one of the adjacent through holes, and connected to the p-side semiconductor layer so as to form electrical connections on the bottom surface of the insulating substrate; and a second electrode which is formed in the other adjacent through hole in a separate manner from the first electrode, and connected to the n-side semiconductor layer so as to form electrical connections on the bottom surface of the insulating substrate. Further, each through hole is sealed by a sealing member such as a conductive bonding agent. Moreover, the LED chips are sealed by a light-transmitting resin. With this arrangement, it is possible to easily mass-produce compact light-emitting devices with high reliability by cutting the insulating substrate along the through holes.

3 Claims, 12 Drawing Sheets

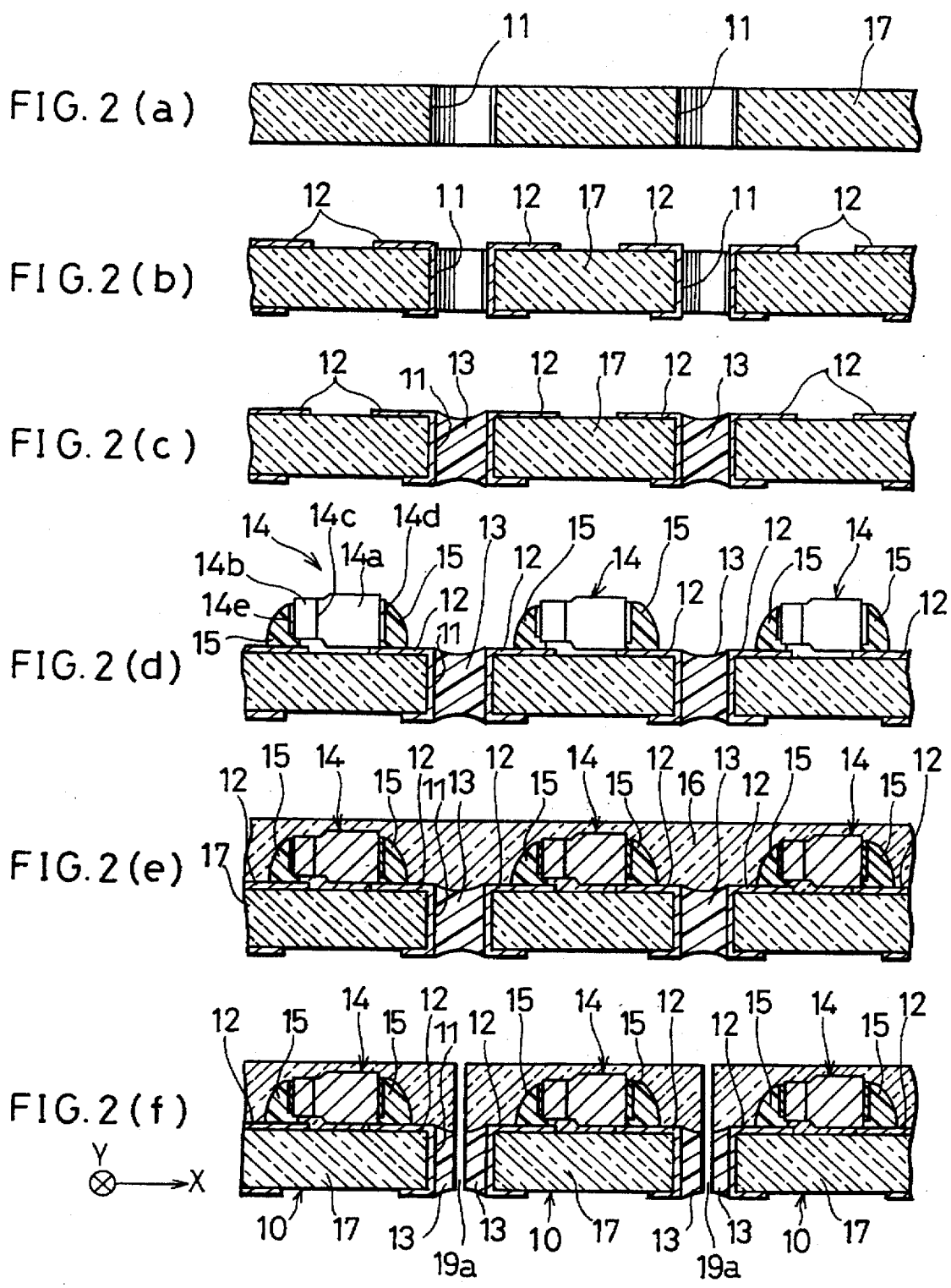

FIG. 3
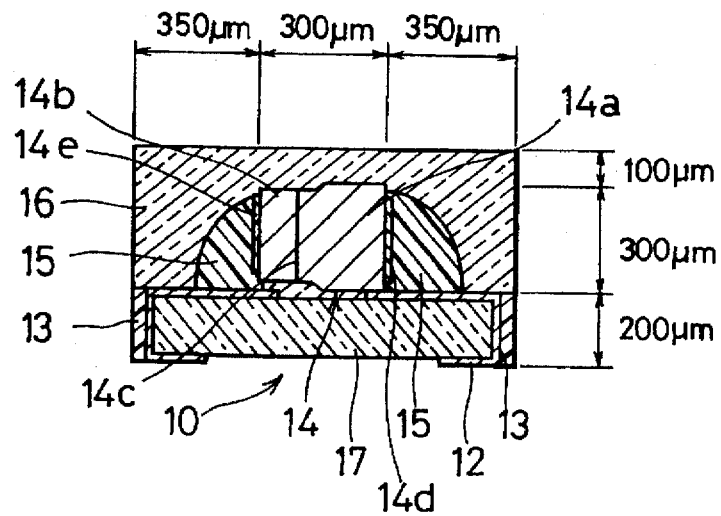
FIG. 4(a)    FIG. 4(b)
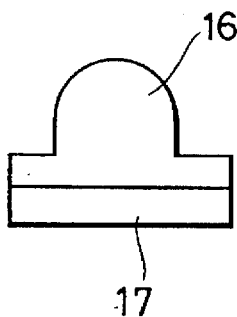 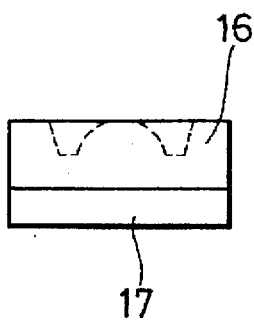
FIG. 5(a)    FIG. 5(b)
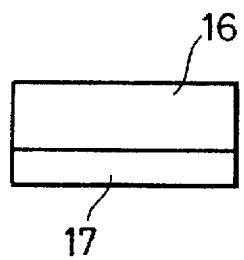 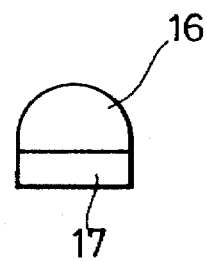

COMPACT LIGHT-EMITTING DEVICE WITH SEALING MEMBER AND LIGHT-TRANSMITTING RESIN SEAL

FIELD OF THE INVENTION

The present invention relates to a light-emitting device of surface-packaging type and its manufacturing method, which is used as a light source for various display panels, a backlight for liquid crystal displays and a light source for lighting switches. In particular, the present invention concerns a light-emitting device using LED (Light-Emitting Diode) chips of small size that have high tolerance to external stress, and its manufacturing method.

BACKGROUND OF THE INVENTION

In general, LED (Light-Emitting Diode) chips are used in light-emitting devices of surface-mounting types that are used as a light source for various display panels, a backlight for liquid crystal displays and a light source for lighting switches. Each LED chip consists of a p-side semiconductor and an n-side semiconductor that are joined into a p-n junction. FIG. 13 shows one example of light-emitting devices wherein such chip parts are used.

In this light-emitting device 60, LED chips 62, which have a n-side semiconductor layer 62a and a p-side semiconductor layer 62b that are mutually joined into a p-n junction, are used. The n-side semiconductor layer 62a of this LED chip 62 is affixed onto a lead frame 61.

The p-side semiconductor layer 62b, which forms the upper surface of the LED chip 62, is electrically connected to a frame 63 on the anode side, which is adjacent to the lead frame 61, by a bonding wire 64 made of a gold line or other lines with a diameter of approximately 10 μm to 40 μm. Here, the bonding wire 64 is shaped like an arc above the LED chip 62 so as not to be cut off by the edges or other portions of the LED chip 62. Moreover, one part of the lead frame 61 and one part of the frame 63 on the anode side are sealed by light-transmitting resin 65 in a manner so as to cover the LED chip 62 and the bonding wire 64.

FIG. 14 is a side view showing one example of light-emitting devices wherein such chip parts are used. In this light-emitting device 70, LED chips 74 are used that have a n-side semiconductor layer 74a and a p-side semiconductor layer 74b that are mutually joined into a p-n junction. In this light-emitting device 70, electrode patterns 72 and 73 are formed by metal plating at respective ends in the length-wise direction of the surface of an insulating substrate 71. The electrode patterns 72 and 73 are bent down from the surface of the insulating substrate 71 along the respective end faces thereof in the length-wise direction, thereby covering the respective end portions of the bottom surface of the insulating substrate 71. Here, the n-side semiconductor layer 74a is affixed onto one of the electrode patterns 72.

The p-side semiconductor layer 74b, which forms the upper surface of the LED chip 74, is electrically connected to the other electrode pattern 73 of the insulating substrate 71 by a bonding wire 75 made of a gold line or other lines with a diameter of approximately 10 μm to 40 μm. Here, the bonding wire 75 is shaped like an arc above the LED chip 74 so as not to be cut off by the edges or other portions of the LED chip 74. Further, the LED chip 74 is sealed by light-transmitting resin 76 together with the bonding wire 75.

As described above, the bonding wires 64 and 75, which are highly susceptible to cutoffs due to external stress, are respectively sealed by the light-transmitting resins 65 and 76.

However, when, upon manufacturing the light-emitting device 60 or the light-emitting device 70, the bonding wire 64 or 75 is soldered to the frame 63 or the electrode pattern 73, the bonding wire 64 or 75 still tends to be cut off. Moreover, the bonding wire 64 or 75 also tends to be cut off by external stress caused by warps or other phenomena of the frame 63 and the insulating substrate 71 that occur after the soldering process.

Furthermore, it is necessary for the bonding wire 64 or 75 to have a distance of approximately 100 μm to 200 μm from the top of the arc formed on the LED chip 62 or 74 to the surface of the LED chip 62 or 74 so as not to be cut off by the edges or other portions of the LED chip 62 or 74. As a result, the light-transmitting resin 65 or 76 needs to be thick to the order of 100 μm above the arc so as to also seal the arc that is formed by the bonding wire 64 or 75. This makes the light-transmitting resin 65 or 76 thicker, causing the light-emitting device 60 or 70 to become bulky.

Moreover, when an LED chip 74, mounted on the insulating substrate 71, is sealed by light-transmitting resin 76, some of the light-transmitting resin 76 in the molten state tends to adhere to the bottom surface of the insulating substrate 71. The light-transmitting resin 76, thus adhered to the bottom surface of the insulating substrate 71, causes adverse effects on wiring and other elements that are installed on the bottom surface of the insulating substrate 71. For this reason, it is necessary to prevent the light-transmitting resin 76 in its molten state from trickling down to the bottom surface of the insulating substrate 71.

In general, when the LED chip 74 is sealed by the light-transmitting resin 76, a jig, a metal mold or other members, which is used to prevent the light-transmitting resin 76 in its molten state from trickling along the side face of the insulating substrate 71 down to the bottom surface, is tightly pressed onto a portion along the edge of the insulating substrate 71. For this reason, it is necessary to provide an area for accepting the jig or other members along the edge of the insulating substrate 71. This also causes the light-emitting device 70 to become bulky.

Moreover, in order to mass-produce light-emitting devices, a number of through holes are formed in an insulating substrate, and a number of LED chips are disposed on the insulating substrate and are sealed by light-transmitting resin. Then, the insulating substrate and light-transmitting resin are subjected to dicing cuts so as to be shaped into each LED chip. In particular, in this arrangement, the light-transmitting resin in its molten state tends to trickle down to the bottom surface of the insulating substrate passing the through holes. For this reason, it is necessary to provide areas for accepting the jigs or other members around the respective through holes.

FIG. 15 shows one example of the minimum dimensions of the light-emitting device 70 of the chip type of FIG. 14. In this light-emitting device 70, a square LED chip 74, each side measuring 300 μm, was used. In this case, the thickness of the insulating substrate 71 was at least 200 μm, the thickness of the LED chip was 300 μm, the distance from the top of the arc of the bonding wire 75 to the upper surface of the LED chip 74 was 200 μm, and the thickness of the light-emitting resin 76 covering the arc was 100 μm. Therefore, the minimum necessary thickness of the light-emitting device 70 was 800 μm.

Furthermore, the length (area) of the insulating substrate 71 in the lengthwise direction, which is required to mount the LED chip 74, was 600 μm, the length required for separating the electrode pattern 73 and the electrode pattern 72 from each other was 200 µm, the length required for connecting the bonding wire 75 and the electrode pattern 73 was 400 µm, and the length required for placing the jig or other members, which is used to prevent the light-transmitting resin 76 installed on the insulating substrate 71, from trickling down to the bottom surface of the insulating substrate 71, was 200 µm along the entire edge of the insulating substrate 71. Therefore, the length of the insulating substrate 71 in the lengthwise direction, which forms the length of the light-emitting device 70 in the lengthwise direction, was 1400 µm (1.4 mm), the minimum necessary length.

In recent years, in order to meet demands for compactness of various display panels, lighting switches and other apparatuses, compact light-emitting devices have been required. Therefore, it is not desirable to have thick light-transmitting resin 65 or 76. However, the thinner the light-transmitting resin 65 or 76 is made, the higher the possibility of cutoff of the bonding wire 64 or 75. This results in a problem of low reliability in light-emitting devices to be produced.

SUMMARY OF THE INVENTION

The first objective of the present invention is to provide a light-emitting device which is compact, have high tolerance to external stress, and can be readily mass produced.

The second objective of the present invention is to provide a manufacturing method by which such light-emitting devices are easily mass produced.

In order to achieve the first objective, a light-emitting device of the present invention is provided with: an insulating substrate through which a plurality of through holes are formed; an LED chip, which consists of a p-side semiconductor layer and an n-side semiconductor layer that are joined into a p-n junction, and is placed between each pair of adjacent through holes; a first electrode which is formed in one of the adjacent through holes, and connected to the p-side semiconductor layer so as to form electrical connections on the bottom surface of the insulating substrate; a second electrode which is formed in the other of the adjacent through holes in a separate manner from the first electrode, and connected to the n-side semiconductor layer so as to form electrical connections on the bottom surface of the insulating substrate; a sealing member for sealing the respective through holes; and a light-transmitting resin for sealing the respective LED chips.

With this arrangement, it becomes possible to easily mass produce light-emitting devices having one or a plurality of LED chips by cutting the insulating substrate covered with the light-transmitting resin along positions of the through holes.

Moreover, since the through holes are sealed by the sealing member, there is no possibility that the light-transmitting resin may flow into the through holes and trickle down to the bottom surface of the insulating substrate. Therefore, it is not necessary to place jigs or other members around the edges of the through holes of the insulating substrate so as to prevent the light-transmitting resin from flowing into the through holes. This eliminates the necessity of providing areas for accepting the jigs around the respective through holes, and makes it possible to further miniaturize light-emitting devices.

Furthermore, since the LED chips in the light-emitting device are respectively sealed by the light-transmitting resin, it is possible to prevent water, dust, or other objects from entering them. As described above, since the surface of the LED chip having the p-n junction is protected by the light-transmitting resin, there is no possibility that the surface having the p-n junction may be damaged even when the light-emitting device is being soldered onto a substrate, and that short circuits may occur. Thus, the light-emitting device has high tolerance to damages due to external stress, and can be easily processed.

Moreover, when the LED chip is disposed so that its surface having the p-n junction is non-parallel to the insulating substrate, it becomes possible to keep the electrodes and the LED chip in a conductive state through a conductive bonding agent without using the bonding wire. Therefore, this light-emitting device is free from damages due to external stress caused by warps or other phenomena of the insulating substrate. Furthermore, different from conventional arrangements, this arrangement eliminates the necessity of having to provide thicker light-transmitting resin so as to protect the bonding wire; therefore, the light-emitting device can be miniaturized to a great degree.

Further, in the case where the LED chip is placed in a bridged state between the electrodes, when the LED chip is sealed by the light-transmitting resin, the light-transmitting resin is allowed to enter gaps between the LED chip and the insulating substrate to become an integral part thereof. Thus, the LED chip is fixed onto the insulating substrate more firmly. Therefore, the light-emitting device becomes more superior in its tolerance to external vibration as well as to thermal stress.

In order to achieve the second objective, the manufacturing method of a light-emitting device of the present invention has steps of: forming a plurality of through holes through an insulating substrate; forming a first electrode and a second electrode between the adjacent through holes in a separated manner from each other; mounting LED chips, each of which consists of a p-side semiconductor layer and an n-side semiconductor layer that are joined into a p-n junction, between the first and second electrodes; bonding the p-side semiconductor layer and the first electrode by using a conductive bonding agent while bonding the n-side semiconductor layer and the second electrode by using a conductive bonding agent; coating the insulating substrate with light-transmitting resin so that the LED chip is sealed therein; and carrying out a process for sealing the through holes prior to the process for coating the insulating substrate with the light-transmitting resin.

With this arrangement, since the through holes are sealed prior to coating the insulating substrate with the light-transmitting resin, it is possible to prevent the light-transmitting resin in its molten state from flowing into the respective through holes when the insulating substrate is coated with the light-transmitting resin. Therefore, it is not necessary to place jigs or other members around the edges of the through holes of the insulating substrate so as to prevent the light-transmitting resin in its molten state from flowing into the through holes. This makes it possible to easily operate the sealing process wherein the light-transmitting resin is used.

Moreover, the above-mentioned method makes it possible to easily produce light-emitting devices, each having a desired number of LED chips.

Furthermore, since the first and second electrodes, to which the LED chip is bonded, are formed in a separated manner for each through hole, it becomes possible to easily mass produce light-emitting devices having one or a plurality of LED chips by cutting the structure at the through holes.

For a fuller understanding of the nature and advantages of the invention, reference should be made to the ensuing detailed description taken in conjunction with the accompanying drawings.

BRIEF DESCRIPTION OF THE DRAWINGS

FIGS. 2(a) through 2(f) are cross-sectional views that respectively show manufacturing processes of the light-emitting device of FIG. 1(a).

FIG. 3 is a cross-sectional view showing dimensions of the light-emitting device of FIG. 1(a).

FIGS. 4(a) and 4(b) are schematic front views that respectively how modified examples of the light-emitting device of FIG. 1(a).

FIG. 5(a) is a schematic front view that shows another modified example of the light-emitting device of FIG. 1(a): FIG. 5(a) is a side view thereof.

DESCRIPTION OF THE EMBODIMENTS

Embodiment 1

Figure 1A:
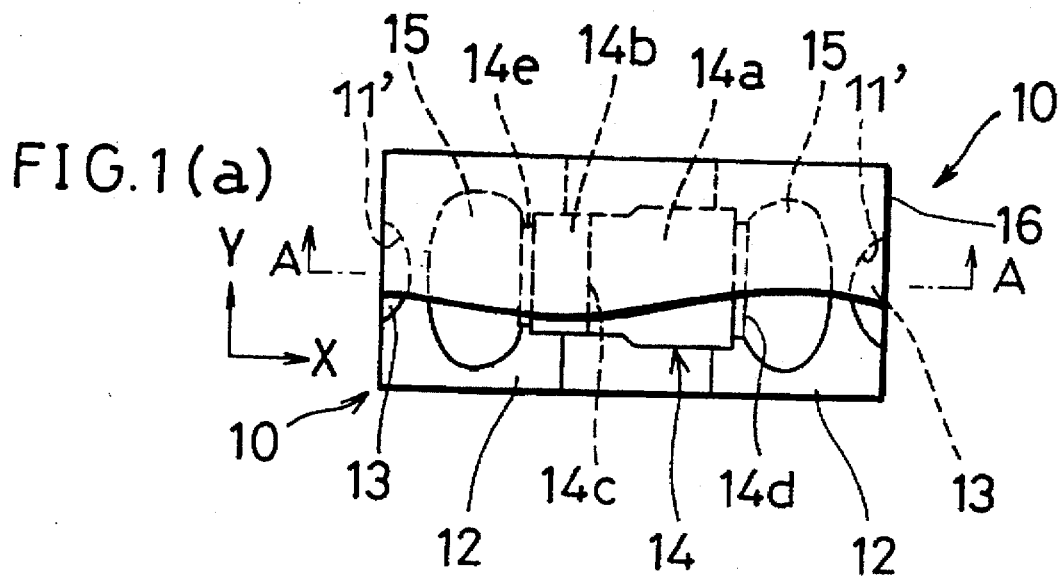
FIG. 1(a) is a plan view showing a light-emitting device in a partial exploded manner that relates to the embodiment the present invention.
Figure 1B:
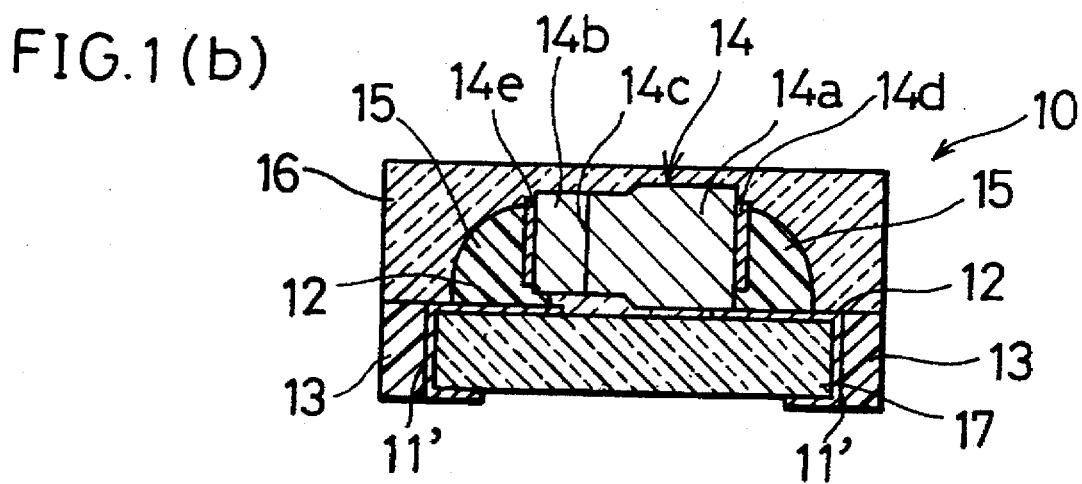
FIG. 1(b) is a cross-sectional view taken along Line A—A of FIG. 1(a).

FIG. 1(a) is a plan view that shows one example of a light-emitting device in a partially exploded manner of the present invention, and FIG. 1(b) is a cross-sectional view taken along Line A—A of FIG. 1(a).

This light-emitting device 10 is provided with an insulating substrate 17 of an oblong shape and an LED (Light-Emitting Diode) chip 14 that is disposed on the insulating substrate 17. The insulating substrate 17 is made of glass epoxy resin, composite, or other materials. Semi-cylindrical recessed portions 11' are provided at the respective ends of the insulating substrate 17 in the lengthwise direction (hereinafter, the lengthwise is referred to as X-direction and the direction orthogonal to X-direction is referred as y-direction). Moreover, a pair of electrode patterns 12 (first electrode and second electrode), which are separated in the center portion in X-direction of the insulating substrate 17, are installed on the surface of the insulating substrate 17. The respective electrode patterns 12 are made of metal plating. The electrode patterns 12 respectively cover the inner surface areas of the recessed portions 11' that are provided at the ends of the insulating substrate 17. Further, the electrode patterns 12 respectively reach the bottom surface of the insulating substrate 17 through the recessed portions 11' in a bent fashion along the bottom surface of the insulating substrate 17.

The recessed portions 11', which are covered with the respective electrode patterns 12, are filled with a conductive bonding agent 13, such as solder, silver (Ag) paste and copper (Cu) paste, which functions as a sealing member. The LED chip 14 is disposed on the respective electrode patterns 12 that cover the surface of the insulating substrate 17 in such a manner that it is bridged from one of the electrode patterns 12 to the other electrode pattern 12. The LED chip 14 consists of an n-side semiconductor layer 14a and a p-side semiconductor layer 14b that are stacked by a p-n junction. Further, an n-side electrode 14d is installed on the surface of the n-side semiconductor layer 14a.

Moreover, a p-side electrode 14e is installed on the surface of the p-side semiconductor layer 14b. The LED chip 14 is disposed between the paired electrode patterns 12 in such a bridged state that a surface 14c having the p-n junction, which forms a joined surface between the n-side semiconductor layer 14a and the p-side semiconductor layer 14b, is kept non-parallel to the insulating substrate 17, or more desirably is kept perpendicular thereto. In this case, the n-side electrode 14d and the p-side electrode 14e are respectively placed perpendicularly to the electrode patterns 12.

The electrode patterns 12 are bonded to the n-side electrode 14d and the p-side electrode 14e, both of which are disposed above the electrode patterns 12, by using a conductive bonding agent 15, such as solder, Ag paste and Cu paste, so that they are kept conductive to each other.

The LED chip 14 and the conductive bonding agent 15 on the insulating substrate 17 are sealed by a light-transmitting resin 16, such as epoxy resin, phenoxy resin, acrylate resin and polyethersulfone resin (PES resin). This light-transmitting resin 16 is molded into a rectangular parallelopiped that follows the respective end faces of the insulating substrate 17 at which the recessed portions 11' are formed and the end faces in the lengthwise direction.

FIGS. 2(a) through 2(f) are cross-sectional views that show manufacturing processes of a light-emitting device 10 shown in FIG. 1(a). In these manufacturing processes, a number of light-emitting devices 10 are produced from one sheet of the insulating substrate 17. First, as shown in FIG. 2(a), a number of through holes 11, each having a round shape in its opening, are formed in the insulating substrate 17 in the form of a matrix, with predetermined pitches in X-direction and Y-direction. Here, as will be described later, the recessed portions 11' are formed by cutting the through holes 11 along dicing lines each of which passes through the center of the through hole 11.

Next, a metal layer is formed by a plating process or other processes so that it covers the entire portions of the insulating substrate 17 including the surface and bottom surface thereof and the inner surfaces of the through holes 11. Then, as illustrated in FIG. 2(b), the surface of the insulating substrate 17 is patterned so that the metal layer is separated at the center portion between the adjacent through holes 11. The bottom surface of the insulating substrate 17 is, on the other hand, patterned so that the metal layer remains only at the surrounding areas of the through hole 11. Thus, the electrode patterns 12, each of which is separated with respect to each through hole 11, are formed in the insulating substrate 17.

Next, as illustrated in FIG. 2(c), the through holes 11, covered with the electrode patterns 12, are filled with the conductive bonding agent 13.

As described above, since the through holes 11 are filled with the conductive bonding agent 13, a plurality of LED chips 14 are installed on the insulating substrate 17 while they are kept conductive to one another.

Thereafter, as illustrated in FIG. 2(d), the LED chip 14 is bridged between the paired electrode patterns 12 on the surface of the insulating substrate 17, which are separated between the adjacent through holes 11, so that the surface 14c having the p-n junction is kept perpendicular to the insulating substrate 17.

Next, the electrode patterns 12 having the bridged LED chip 14 are bonded to the n-side electrode 14d and the p-side electrode 14e of the LED chip 14a by using the conductive bonding agent 15 so that they are kept conductive to each other. In this case, commonly used conductive bonding agents, such as solder, Ag paste and Cu paste, can be adopted as the conductive bonding agent 15. However, in the case of using solder as the conductive bonding agent 15, impurities, contained in the solder, tend to reach the surface 14c having the p-n junction, thereby causing short-circuits. Therefore, it is preferable to use conductive pastes such as Ag paste and Cu paste.

As described above, in the light-emitting device 10 of the present embodiment, the LED chip 14 is disposed between the paired electrode patterns 12 so that its surface 14c having the p-n junction is non-parallel to the insulating substrate 17. Therefore, it becomes possible to keep the electrodes and the LED chip in a conductive state through a conductive bonding agent without using the bonding wire. As a result, the light-emitting device 10 is free from damages due to external stress caused by warps or other phenomena of the insulating substrate 17. Furthermore, different from conventional arrangements, this arrangement eliminates the necessity of having to make thicker light-transmitting resin, which will described later, so as to protect the bonding wire; therefore, the light-emitting device 10 can be miniaturized to a great degree.

Next, as illustrated in FIG. 2(e), a sheet of the light-transmitting resin 16 is placed on the surface of the insulating substrate 17, and is pressed under vacuum with heat. Light-transmitting resin, such as epoxy resin, phenoxy resin, acrylate resin or PES resin, is used as the sheet of the light-transmitting resin 16. Thus, the LED chip 14 is sealed by the light-transmitting resin 16.

Here, the respective through holes 11, provided in the insulating substrate 17, are filled with the conductive bonding agent 13. This prevents the light-transmitting resin 16 in the molten state from flowing into the respective through holes 11 and trickling down to the bottom surface of the insulating substrate 17.

Therefore, when the light-transmitting resin 16 in the molten state is pressed onto the insulating substrate 17, it is only necessary to place the metal mold or the jig or other members around the surrounding edge of the insulating substrate 17, and this arrangement makes it possible to prevent the light-transmitting resin 16 in the molten state from trickling down to the bottom surface of the insulating substrate 17 along the sides thereof.

In other words, it is not necessary to place jigs or other members around the edges of the through holes 11 of the insulating substrate 17 so as to prevent the light-transmitting resin 16 in the molten state from flowing into the through holes 11. This also eliminates the necessity of providing areas for accepting the jigs around the respective through holes 11. As a result, the sealing process using the light-transmitting resin 16 can be readily carried out. Further, it is possible to miniaturize the entire structure of the light-emitting device 10.

Moreover, since the surface 14c having the p-n junction is kept perpendicular to the insulating substrate 17, there is no electrode layer that blocks emitted light. This makes it possible to improve the efficiency of light emission to be externally applied. Furthermore, since the thickness of the light-emitting resin 16 required for sealing the LED chip 14 is further reduced, it is possible to make the light-emitting device 10 more compact.

Further, in the arrangement wherein the LED chip 14 is placed in a bridged state between the electrode patterns 12, when the LED chip 14 and the conductive bonding agent 15 are sealed by the light-transmitting resin 16, the light-transmitting resin 16 is allowed to enter gaps between the LED chip 14 and the insulating substrate 17 to become an integral part thereof. Thus, the LED chip 14 is fixed onto the insulating substrate 17 more firmly. Therefore, the light-emitting device 10 becomes more superior in its tolerance to external vibration as well as to thermal stress.

After the light-transmitting resin 16 has hardened to seal the respective LED chips 14 on the insulating substrate 17, the insulating substrate 17 and the light-transmitting resin 16 are subjected to dicing cuts along dicing lines 19a which pass through the centers of the through holes 11 that are arranged in Y-direction as shown in FIG. 2(f). Further, the insulating substrate 17 and the light-transmitting resin 16 are also subjected to dicing cuts between the LED chips 14 that are adjacent in Y-direction. Thus, a number of the light-emitting devices 10, each having one LED chip 14, can be produced.

As described above, in the light-emitting device 10, since the LED chips 14 and the conductive bonding agent 15 are sealed by the light-transmitting resin 16, it is possible to prevent water, dust, or other objects from entering the light-emitting device 10. Moreover, the LED chips 14 are connected to the insulating substrate 17, and the surface 14c having the p-n junction is protected by the light-transmitting resin 16. Therefore, during actual processes, for example, such as a process wherein the light-emitting device 10 is being soldered onto a circuit board, there is no possibility that the surface 14c having the p-n junction may be damaged, and that short circuits may occur. Thus, the light-emitting device has high tolerance to damages due to external stress, and can be easily processed.

Moreover, in the case when the light-emitting device 10 is soldered onto a circuit board before it is used, since the electrode patterns 12 are designed to reach the bottom surface of the insulating substrate 17, it is not necessary to provide inserting holes for accepting lead pins in the circuit board. These inserting holes are required when the light-emitting device 10 is soldered onto the circuit board, for example, by using lead pins or other members instead of the electrode patterns 12.

Furthermore, in the light-emitting device 10, since the electrode patterns 12 are designed to reach the bottom surface of the insulating substrate 17, it is possible to solder the electrode patterns 12 on the surface of the circuit board.

Here, the through hole 11 is filled with the conductive bonding agent 13. Therefore, when the insulating substrate 17 and the light-transmitting resin 16 are subjected to dicing cuts along dicing lines 19a each of which passes through the center of the through hole 11, each cut portion functions as an electrode that is used when the light-emitting device 10 is soldered to the substrate. This makes it possible to solder the light-emitting device 10 to the substrate more firmly, without increasing the entire thickness.

In other words, the light-emitting device 10 is superior in working efficiency, and by using the light-emitting device 10, it becomes possible to miniaturize the entire structure of an apparatus wherein the light-emitting device 10 is used. Additionally, in the case of fixing the light-emitting device 10 by the use of lead pins or other members, the soldering process is carried out on the reverse side of the circuit board. This makes the entire structure of the device thicker.

FIG. 3 shows one example of the dimensions of the light-emitting device 10 that is manufactured as described above. In the light-emitting device 10 of the present embodiment, a square LED chip 14, each side measuring 300 µm, was used. In this case, the thickness of the insulating substrate 17 and the electrode patterns 12 was 200 µm, the thickness of the LED chip 14 was 300 µm, and the thickness of the light-emitting resin 16 covering the LED chip 14 was 100 µm. Therefore, the minimum necessary thickness of the light-emitting device 10 was 600 µm.

Moreover, in the LED chip 14, the length of the n-side semiconductor layer 14a and the p-side semiconductor layer 14b in the stacking direction was 300 µm, and the lengths, which were necessary for the electrode patterns 12 to be electrically connected to the n-side electrode 14d and the p-side electrode 14e by the conductive bonding agent 15, were respectively 350 µm. Therefore, the dimension of the light-emitting device 10 in X-direction was 1000 µm (1.0 mm), the minimum necessary dimension.

Therefore, when compared with the conventional arrangement, the light-emitting device 10 of the present embodiment makes it possible to reduce the thickness by 200 µm from 800µm to 600 µm, and also to shorten the length in the lengthwise direction by 600 µm from 1600 µm to 1000 µm.

Furthermore, as illustrated in FIG. 4, the light-emitting device of the present invention may be modified so that the light-transmitting resin 16, which is placed on the insulating substrate 17, is formed into various lens shapes. For example, as illustrated in FIG. 4(a), the light-transmitting resin 16 is formed into a convex-lens shape having a semi-spherical protruding portion, or as illustrated in FIG. 4(b), it is formed into a convex-lens shape that is provided as an inner semi-spherical recessed portion. Moreover, as illustrated in FIGS. 5(a) and 5(b), the light-transmitting resin 16 may be molded into a rod-lens shape having a semi-cylindrical portion.

In the case of forming the light-transmitting resin 16 into lens shapes, pressing jigs, which are suitable for the respective lens shapes, are pressed onto a sheet of the light-transmitting resin 16, when the sheet of the light-transmitting resin 16 is placed on the insulating substrate 17 having the LED chips 14 disposed thereon, and pressed under heat.

The light-transmitting resin 16, which has been thus formed into the various lens shapes, makes it possible to converge light more effectively, thereby improving the luminance of the device.

Moreover, when the LED chips 14 are sealed by the light-transmitting resin 16, the insulating substrate 17 may be disposed inside a metal mold with a predetermined shape instead of using the sheet of the light-transmitting resin 16, and the light-transmitting resin 16 in the molten state may be poured into the metal mold. In this case also, since the respective through holes 11 of the insulating substrate 17 are filled with the conductive bonding agent 13, it is possible to prevent the light-transmitting resin 16 in the molten state from trickling down to the bottom surface of the insulating substrate 17.

Figure 6:
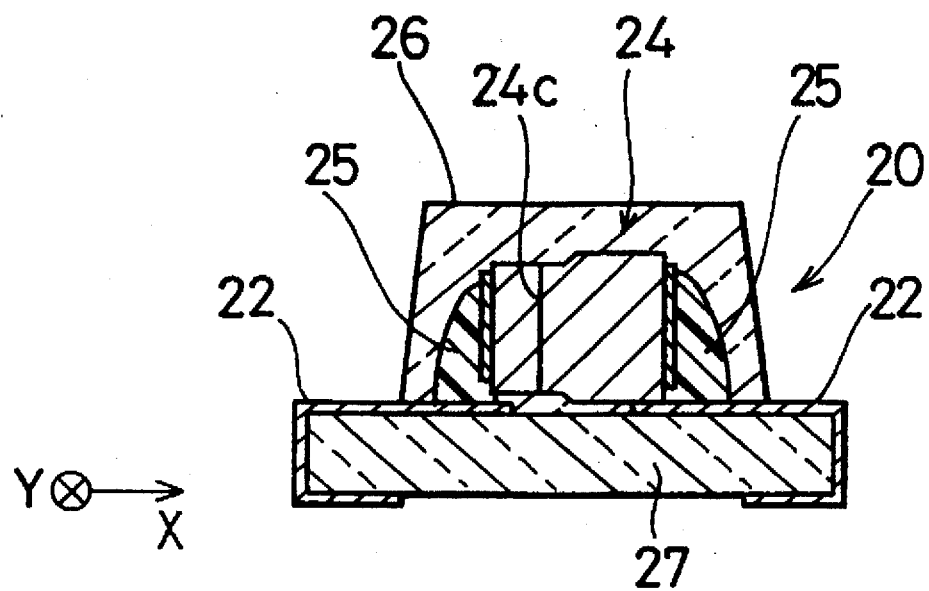
FIG. 6 is a cross-sectional view showing a light-emitting device that has no through holes.

FIG. 6 is a cross-sectional view showing a light-emitting device 20 that has no through holes. In this light-emitting device 20, a pair of electrode patterns 22, which are separated in the center portion in X-direction of an insulating substrate 27, are placed on the surface and the reverse side of the insulating substrate 27 along the respective sides of the insulating substrate 27. In the same manner as the aforementioned embodiment, the LED chip 24 is bridged between the paired electrode patterns 22 so that a surface 24c having the p-n junction is kept non-parallel to the insulating substrate 27, or more desirably, is kept perpendicular thereto. The LED chip 24 and the electrode patterns 22 are bonded by using a conductive bonding agent 25 so that they are kept conductive to each other. Further, the conductive bonding agent 25 and the LED chip 24 are sealed by a light-transmitting resin 26 that is formed on the insulating substrate 27. Here, the insulating substrate 27, the electrode patterns 22, the LED chip 24 and the conductive bonding agent 25 are respectively made of the same materials as the insulating substrate 17, the electrode patterns 12, the LED chip 14 and the conductive bonding agent 15.

The light-emitting device 20 of the present embodiment is manufactured by mounting one LED chip 24 on one sheet of the insulating substrate 27 that has been shaped into a predetermined size. Therefore, neither through holes nor recessed portions are provided in the insulating substrate 27.

In this light-emitting device 20, it is necessary to provide, along the entire surrounding edge of the insulating substrate 27, areas for accepting the metal mold, jig or other members that prevents the light-transmitting resin 26 in the molten state from trickling down to the bottom surface of the insulating substrate 27. For this reason, the lengths in the lengthwise direction and in the width-wise direction of the insulating substrate 27 are slightly longer than those of the light-emitting device 10 of the aforementioned embodiment. However, the light-emitting device 20 does not need to use the bonding wire, which is the same as the aforementioned embodiment. Therefore, compared with the conventional light-emitting device, the light-emitting device 20 makes it possible to shorten the thickness of the light-transmitting resin 26, thereby miniaturizing the device.

In the light-emitting device 20 also, the light-transmitting resin 26, which is to be placed on the insulating substrate 27, may be formed into various lens shapes.

Embodiment 2

Referring to FIG. 7, the following description will discuss another embodiment of the present invention. Here, for convenience of explanation, those members that have the same functions and that are described in embodiment 1 are indicated by the same reference numerals and the description thereof is omitted.

Figure 7A:
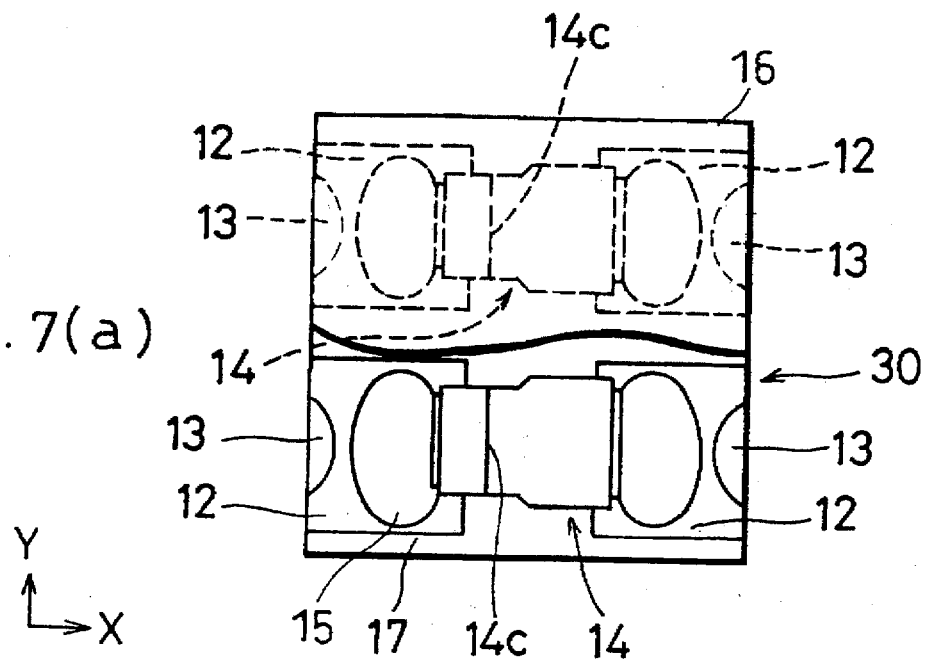
FIGS. 7(a) and 7(b) are plan views showing light-emitting devices in partially exploded manner that relate to other embodiments of the present invention.

For example, as shown in FIG. 7(a), the light-emitting device 30 of the present embodiment is provided with two LED chips 14 that are placed on one insulating substrate 17. In order to obtain the light-emitting device 30 of this structure, a number of LED chips 14 are first mounted on one sheet of insulating substrate 17, and the insulating substrate 17 is entirely sealed by light-transmitting resin 16, as shown in FIGS. 2(a) through 2(f). Next, the insulating substrate 17 and the light-transmitting resin 16, in this state, are subjected to dicing cuts along dicing lines 19a that extend in Y-direction, that is, in the axis direction of the insulating substrate 17. Then, the insulating substrate 17 and the light-transmitting resin 16 are again subjected to dicing cuts in X-direction so that the two LED chips 14 adjacent to each other in Y-direction form one integral unit; thus, the light-emitting device 20 is easily manufactured.

Figure 7B:
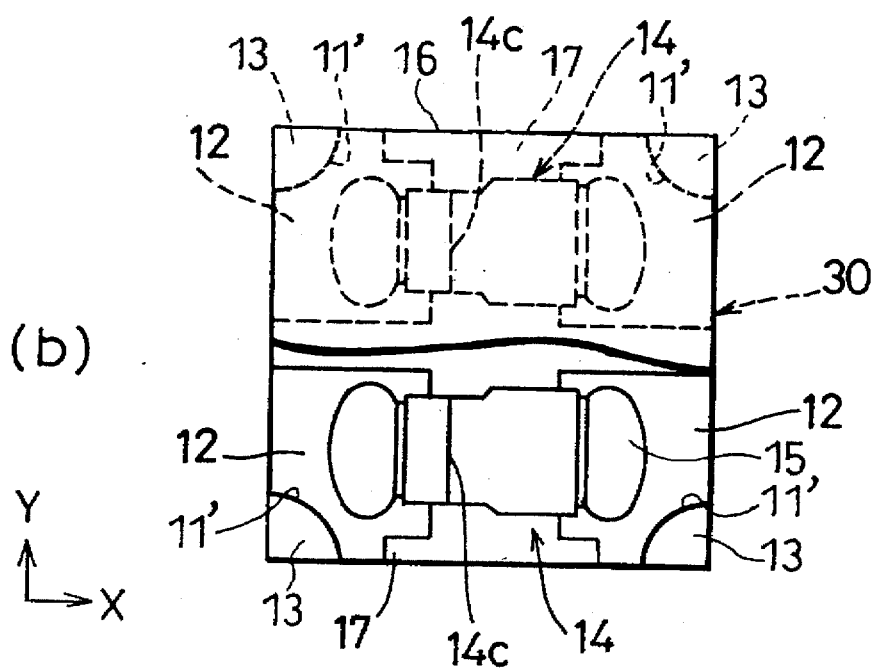
Figure 8:
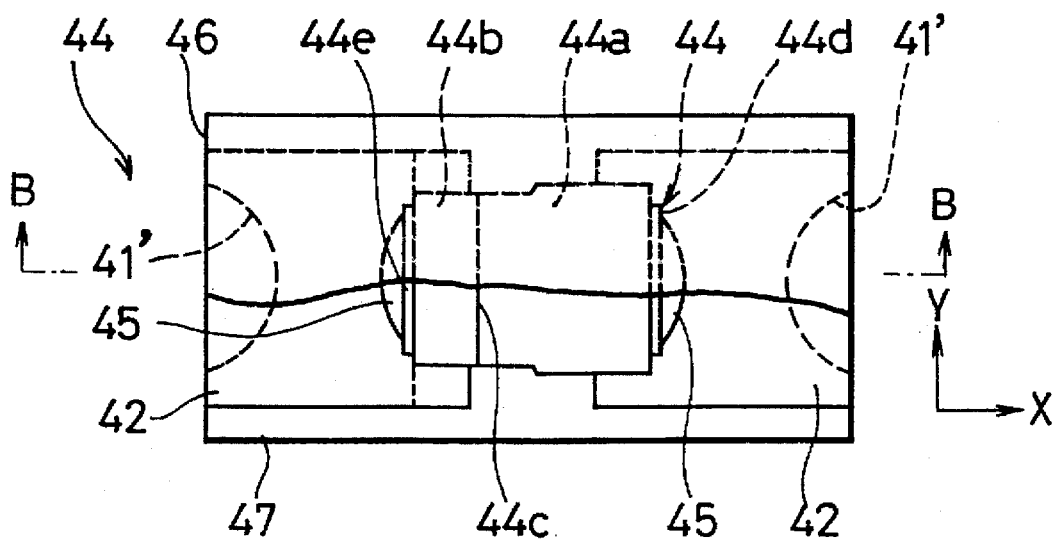
FIG. 8(a) is a plan view showing a light-emitting device in a partially exploded manner that relates to still another embodiment of the present invention.
FIG. 8(b) is a cross-sectional view taken along Line B—B of FIG. 8(a).
Figure 8:
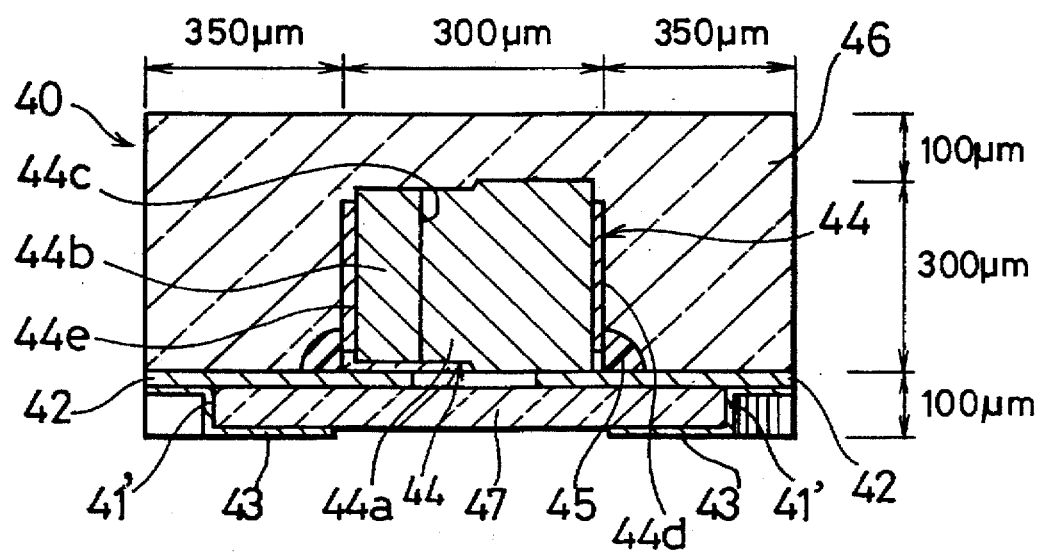
Figure 9:
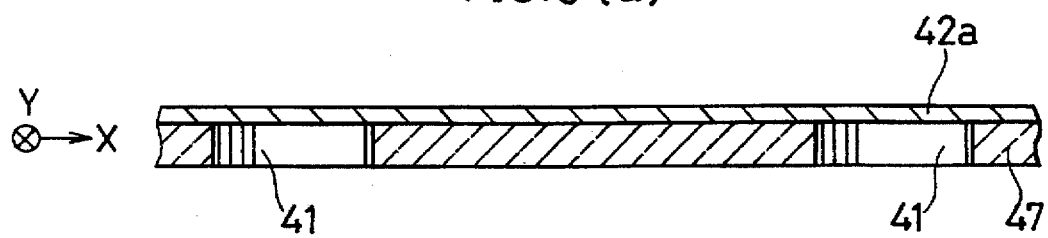
FIGS. 9(a) through 9(c) cross-sectional views that show essential parts of an insulating substrate in manufacturing processes of the light-emitting device of FIG. 8(a).
Figure 9:
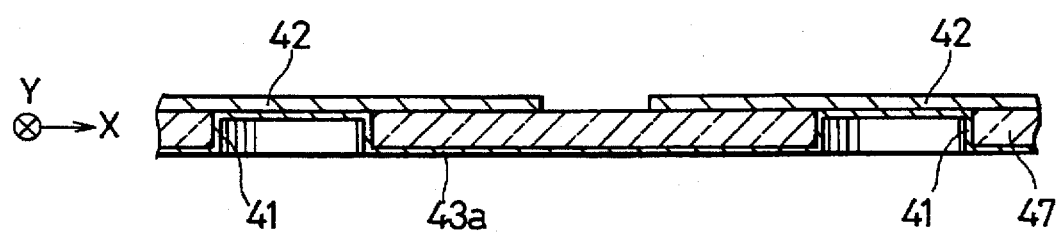
Figure 9:
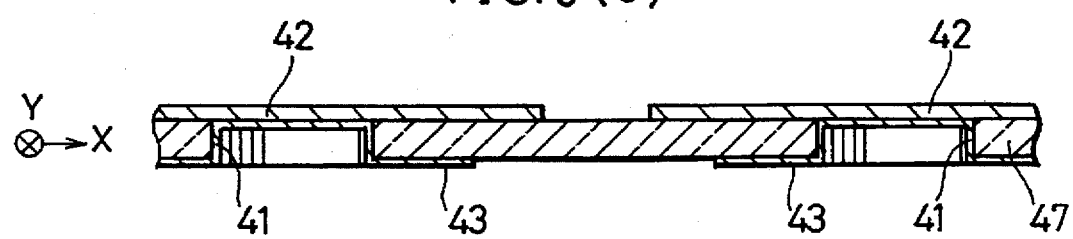
Figure 10:
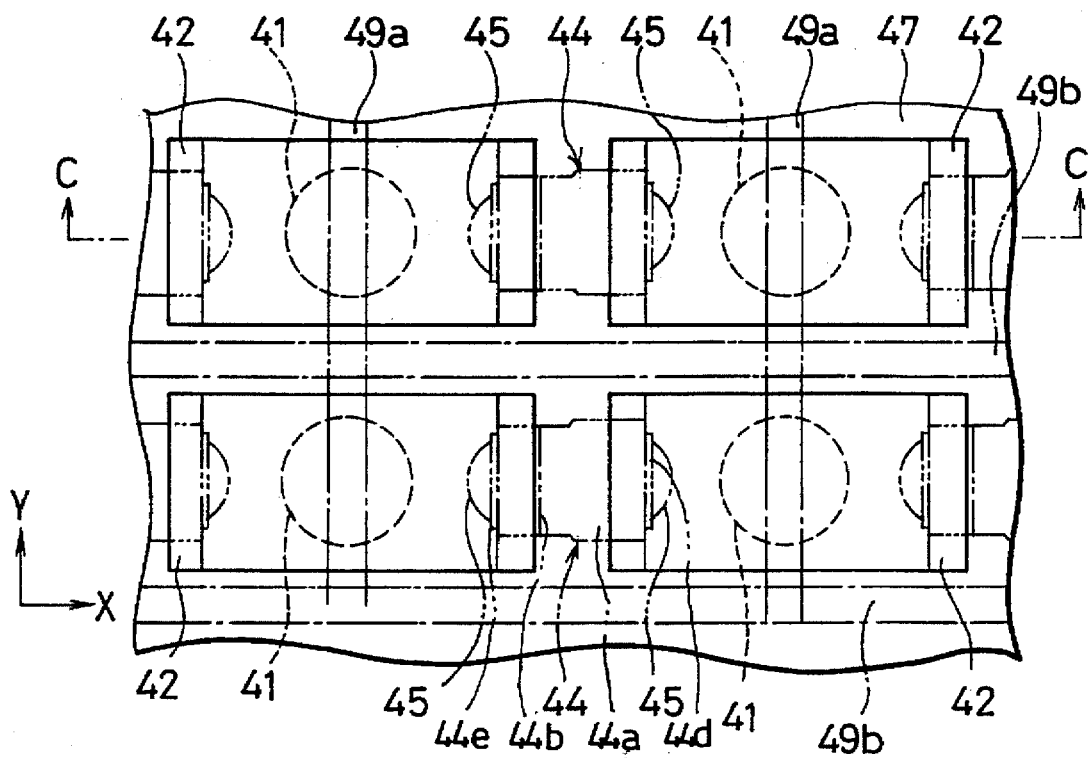
FIG. 10(a) is a schematic plan view of the insulating substrate that indicates fixing positions of LED chips.
FIG. 10(b) is a cross-sectional view taken along Line C—C of FIG. 10(a).
Figure 10:
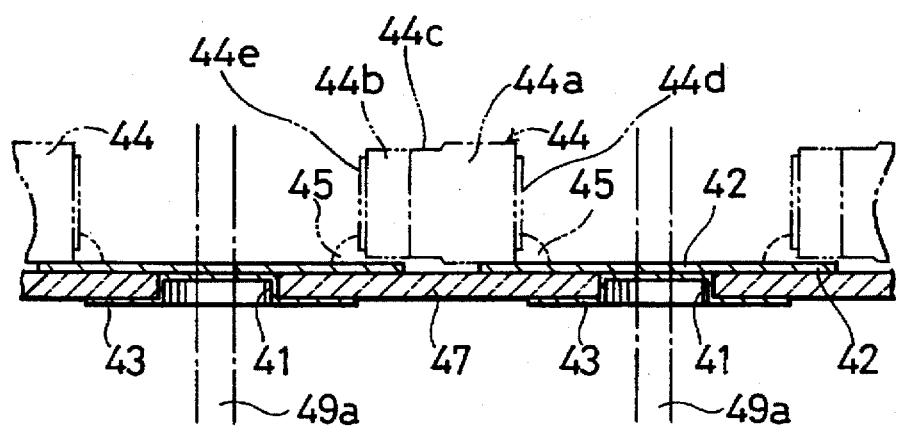

Further, as shown in FIG. 7(b), another arrangement may be proposed, wherein through holes 11, which form recessed portions 11' later, are preliminarily formed at corners of the installation position of the two LED chips 14 (the area on which the LED chips 14 are installed) in a manner so as to surround the LED chips 14. With this arrangement, after the insulating substrate 17 has been cut along the dicing lines that pass through the through holes 11, recessed portions 11' are formed at the four corners that surround the two LED chip 14.

In this case also, the respective electrode patterns 12 reach the bottom surface of the insulating substrate 17 from the surface of the insulating substrate 17 through the through holes 11 (corresponding to the recessed portions 11' after the insulating substrate 17 has been cut) in a bent fashion along the bottom surface of the insulating substrate 17. Thus, the LED chips 14 are bonded to the electrode patterns 12, which are separated by each through hole 11, by a conductive bonding agent 15 so as to keep a conductive state.

In this arrangement, the through holes 11, which are preliminarily formed in a manner so as to surround the installation position of the two LED chips 14, are recognized as target points when the dicing cuts are conducted so that the two LED chips 14 adjacent to each other in Y-direction form one integral unit. This makes it possible to carry out the dicing-cut process more easily.

Moreover, in this case also, the light-emitting device 30 may be manufactured by mounting two LED chips 14 on the insulating substrate 17 that has been preliminarily formed into a predetermined shape.

Furthermore, in the light-emitting device of the present invention, the number of LED chips is not intended to be limited to one or two: For example, three or more LED chips may be installed. In this case also, the light-emitting device may be manufactured as follows: After a number of LED chips have been mounted on an insulating substrate and have been sealed by light-transmitting resin, the substrate is subjected to dicing cuts that divide it into pieces, each having a desired number of LED chips. Further, the light-emitting device may be manufactured by mounting a predetermined number of LED chips on the insulating substrate that has been preliminarily formed into a predetermined shape.

Here, since the through holes 11 are filled with the conductive bonding agent 13, a plurality of LED chips 14 are installed on the insulating substrate 17 so that they are kept conductive to each other. In the case when a light-emitting device having a plurality of LED chips is used, this arrangement makes it possible to reduce portions to which voltage is applied.

Additionally, in the light-emitting device 30 in the present invention also, the light-transmitting resin 16, which is to be placed on the insulating substrate 17, may be formed into various lens shapes at its portions related to the respective LED chips 14, in the same manner as the aforementioned embodiments.

EMBODIMENT 3

Referring to FIGS. 8 through 11, the following description will discuss still another embodiment of the present invention.

FIG. 8(a) is a plan view showing a light-emitting device 40 in a partially exploded manner that relates to still another embodiment of the present invention: FIG. 8(b) is a cross-sectional view taken along Line B—B of FIG. 8(a).

The light-emitting device 40 of the present embodiment is provided with an insulating substrate 47 having a rectangular shape and an LED chip 44 that is disposed on the insulating substrate 47. The insulating substrate 47 is made of glass epoxy resin, composite or other materials, in the same manner as the aforementioned embodiments.

The insulating substrate 47 is provided with recessed portions 41' at its respect ends in X-direction, that is, in the length-wise direction. Each recessed portion 41' has a semi-cylindrical cut-out shape. A pair of rectangular electrode patterns (the first and second electrodes) 42 are installed on the surface of the insulating substrate 47. The paired electrode patterns 42 are separated from each other with a predetermined gap at the center portion of the insulating substrate 47 in the length-wise direction.

In the present embodiment, the respective end portions of the electrode patterns 42 cover the recessed portions 41' in the insulating substrate 47. In other words, the respective electrode patterns 42 also function as sealing members that cover the recessed portions 41'.

Further, metal layers 43 are stacked on the respective ends of the bottom surface of the insulating substrate 47 in the length-wise direction. The metal layers 43, which pass through the inner surfaces of the recessed portions 41' formed in the insulating substrate 47, are fixed to the reverse sides of the electrode patterns 42 that cover the recessed portions 41'.

The LED chip 44 is bridged between the paired electrode patterns 42 that have been disposed on the surface of the insulating substrate 47. The LED chip 44 consists of an n-side semiconductor layer 44a and a p-side semiconductor layer 44b that are joined into a p-n junction in the same manner as the aforementioned embodiments. Further, an n-side electrode 44d is installed on the surface of the n-side semiconductor layer 44a. A p-side electrode 44e is installed on the surface of the p-side semiconductor layer 44b. Here, the LED chip 44 is disposed between the paired electrode patterns 42 in such a bridged state from one electrode pattern 42 to the other electrode pattern 42 that a surface 44c having the p-n junction, which forms a joined surface between the n-side semiconductor layer 44a and the p-side semiconductor layer 44b, is kept non-parallel to the insulating substrate 47, or more desirably is kept perpendicular thereto. In this case, the n-side electrode 44d and the p-side electrode 44e are respectively placed perpendicularly to the electrode patterns 42.

The electrode patterns 42 are bonded to the n-side electrode 44d and the p-side electrode 44e by using a conductive bonding agent 45, such as solder, Ag paste and Cu paste, so that they are kept conductive to each other.

The LED chip 44 and the conductive bonding agent 45 on the insulating substrate 47 are sealed by a light-transmitting resin 46, such as epoxy resin, ethylene-vinyl acetate copolymer (EVA), phenoxy resin, acrylate resin and PES resin. This light-transmitting resin 46 is molded into a rectangular parallelopiped that follows the respective end faces of the insulating substrate 47.

FIGS. 9(a) through 9(c) are cross-sectional views that show the essential part of the insulating substrate 47 in the manufacturing processes of the light-emitting device 40. First, as shown in FIG. 9(a), through holes 41, each having a round shape in its opening, are formed in the insulating substrate 47 in the form of a matrix, with a pitch of 1.1 mm in X-direction (that is, in the length-wise direction of the light-emitting device 40) and with a pitch of 0.6 mm in Y-direction orthogonal to X-direction (that is, in the widthwise direction of the insulating substrate 47). Then, a metal foil 42a such as copper foil is laminated on the entire surface of the insulating substrate 47. Thus, the through holes 41 of the insulating substrate 47 are completely covered with the metal foil 42a. Here, as will be described later, the recessed portions 41' are formed by cutting the through holes 41 along dicing lines each of which passes through the center of the through hole 41.

Next, as illustrated in FIG. 9(b), the metal foil 42a is patterned into a rectangular shape for each through hole 41 that is formed in the insulating substrate 47. Thus, electrode patterns 42, each of which has a rectangular shape and covers each through hole 41 in a concentric manner, are respectively formed in a separate state from each other.

Thereafter, the insulating substrate 47 is subjected to a copper plating process in its entire bottom surface. Next, nickel and gold plating processes (or silver plating process and palladium plating process) are applied thereon. In this case, the inner surfaces of the through holes 41 and the entire reverse sides of the electrode patterns 42 that cover the through holes 41 are also subjected to the plating processes. As a result, a metal layer 43a is formed on the entire bottom surface of the insulating substrate 47, on the inner surfaces of the through holes 41, and on the reverse sides of the electrode patterns 42 that cover the through holes 41.

Thereafter, as illustrated in FIG. 9(c), the bottom surface of the insulating substrate 47 is patterned so that the metal layer 43a is separated at the center portion between the adjacent through holes 41. Pieces of the metal layer 43, each of which is plated to the reverse side of the electrode pattern 42, which is installed on the surface of the insulating substrate 47, passing through the through hole 41, are respectively formed in a separate manner from each other.

In other words, each piece of the metal layer 43, which is made of copper, nickel and gold, covers the inner surface of each through hole 41, and also covers the surrounding area of the through hole 41 in its rectangular shape on the bottom surface of the insulating substrate 47.

Further, the following method may be adopted in order to obtain the structure shown in FIG. 9(c): First, there is provided a two-sided substrate that consists of an insulating circuit board made of aramid or other insulating materials and copper foils (metal layers) formed on the surface and bottom surface thereof. Then, the copper foil, formed on the bottom surface of the two-sided substrate, is removed by etching at areas in which recessed portions are to be formed. Here, the recessed portions correspond to the through holes 41 on which the electrode patterns 42 are formed. Then, the recessed portions are formed by projecting a laser light beam onto the areas in which recessed portions are to be formed and from which the copper foil has been removed. In this case, with respect to the portions on which the copper foil is left, the copper foil is not removed even when the laser light beam is projected thereon. Thus, with respect to the areas in which recessed portions are to be formed and from which the copper foil has been removed, only the circuit board is decomposed by the projection of the laser light beam so that the recessed portions are easily created.

Thereafter, the entire surface and bottom surface of the two-sided substrate, which include the inner walls of the recessed portions, are subjected to a copper plating process so that plating layers (metal layers) are formed on the entire surface and bottom surface of the two-sided substrate. Further, the plating layers, formed on the surface and bottom surface of the two-sided substrate, are subjected to patterning processes with respect to each recessed portion. The structure, illustrated in FIG. 9(c), is obtained by further applying nickel and gold plating processes to the abovementioned surfaces.

Additionally, the through holes 41 may be formed by an etching process, instead of projecting the laser light beam.

FIG. 10(a) is a schematic plan view that indicates fixing positions on the insulating substrate 47 shown in FIG. 9(c) to which LED chips 44 are fixed: FIG. 10(b) is a cross-sectional view taken along Line C—C of FIG. 10(a).

In the state of the insulating substrate 47 shown by FIG. 9(c), the LED chip 44 is bridged between the electrode patterns 42 that are adjacent in X-direction, as shown by an alternate long and two short dashes line in FIGS. 10(a) and 10(b).

Thereafter, the electrode patterns 42 having the bridged LED chip 44 are bonded to the n-side electrode 44d and the p-side electrode 44e by using the conductive bonding agent 45 so that they are kept conductive to each other.

Figure 11A:
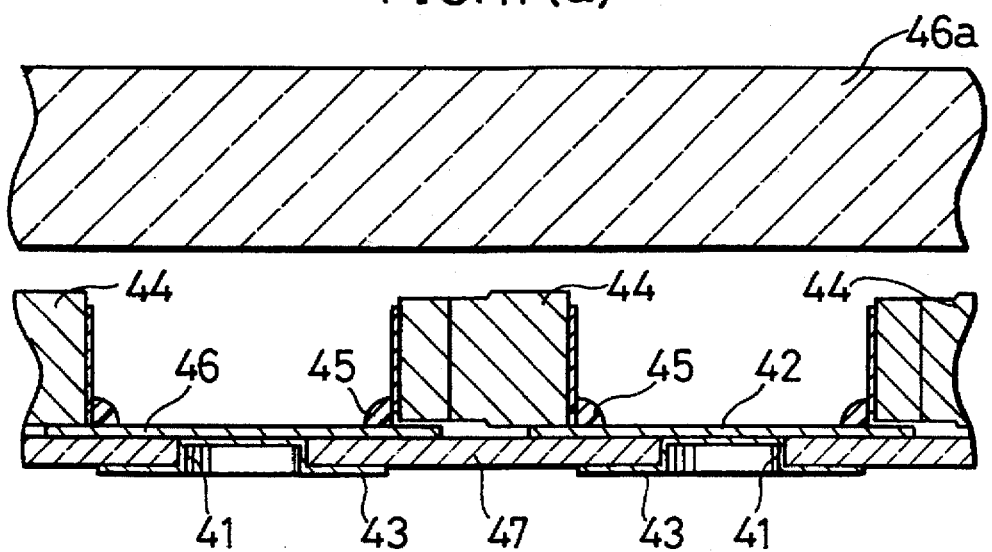
FIGS. 11(a) through 11(c) are cross-sectional views of manufacturing processes of the light-emitting device of FIG. 8(a).
Figure 11B:
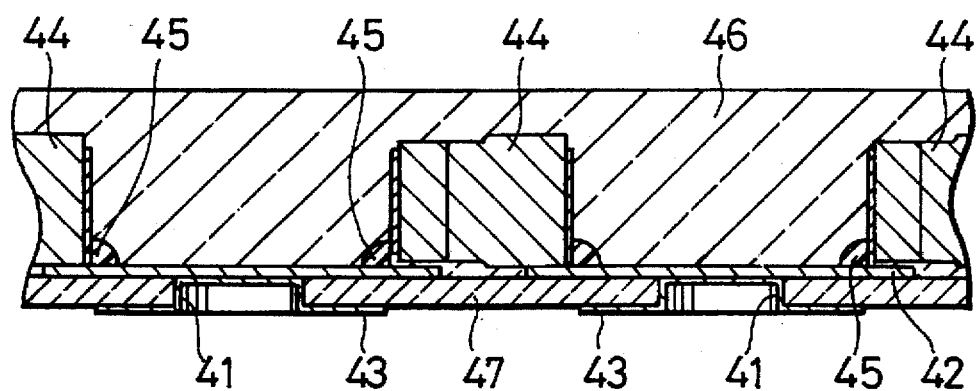

Next, as illustrated in FIG. 11(a), a light-transmitting resin sheet 46a is placed on the surface of the insulating substrate 47, and pressed under vacuum with heat. Thus, the LED chips 44 are sealed by the light-transmitting resin 46, as illustrated in FIG. 11(b).

In this case, the through holes 41, provided in the insulating substrate 47, are covered with the electrode patterns 42. Therefore, it is possible to prevent the light-transmitting resin 46 in the molten state from flowing into the respective through holes 41 and trickling down to the bottom surface of the insulating substrate 47.

Therefore, when the light-transmitting resin 46 in the molten state is pressed onto the insulating substrate 47, it is only necessary to place the metal mold, the jig or other members, which is used for preventing the light-transmitting resin 46 in the molten state from trickling down to the bottom surface along the side faces of the insulating substrate 47, around the surrounding edge of the insulating substrate 47.

In other words, it is not necessary to place jigs or other members around the edges of the through holes 41 of the insulating substrate 47 so as to prevent the light-transmitting resin 46 in the molten state from flowing into the through holes 41. This also eliminates the necessity of providing areas for accepting the jigs around the respective through holes 41. As a result, the sealing process using the light-transmitting resin 46 can be readily carried out. Further, it is possible to miniaturize the entire structure of the light-emitting device 40.

As described above, instead of the arrangement wherein the electrode patterns 42 are bent down from the surface of the insulating substrate 47 along the bottom surface of the insulating substrate 47 through the inner surfaces of the through holes 41, the light-emitting device 40 of the present embodiment is arranged so that portions, which will become electrode terminals, are formed on the bottom surface of the insulating substrate 47 by applying a plating process to the bottom surface of the insulating substrate 47. This makes it possible to manufacture light-emitting devices more easily.

Figure 11C:
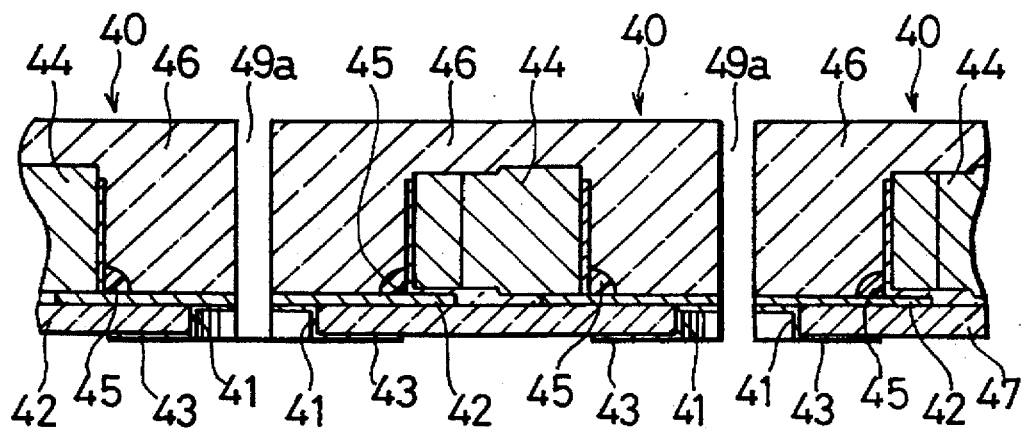

After the light-transmitting resin 46 has hardened to seal the respective LED chips 44 on the insulating substrate 47, the insulating substrate 47 and the light-transmitting resin 46 are subjected to dicing cuts along dicing lines 49a which pass through the centers of the through holes 41 that are arranged in Y-direction, as illustrated in FIGS. 10(a) and 10(b). The insulating substrate 47 and the light-transmitting resin 46 are subjected to dicing cuts along dicing lines 49b which extend in X-direction between the electrode patterns 42 that are arranged in Y-direction. Thus, as illustrated in FIG. 11(c), a number of the light-emitting devices 40 shown in FIG. 8, each having one LED chip 44, can be produced.

FIG. 8(b) shows one example of the dimensions of the light-emitting device 40 that is manufactured as described above. In the light-emitting device 40 of the present embodiment, a square LED chip 44, each side measuring 300 µm, was used. In this case, the thickness of the insulating substrate 47, each electrode patterns 42 and each metal layer 43 was 100 µm, the thickness of the LED chip 44 was 300 µm, and the thickness of the light-emitting resin 46 covering the LED chip 44 (thickness) was 100 µm. Therefore, the minimum necessary thickness of the light-emitting device 40 was 500 µm.

Moreover, in the LED chip 44, the length of the n-side semiconductor layer 44a and the p-side semiconductor layer 44b in the stacking direction was 300 µm, and the lengths, which were necessary for the electrode patterns 42 to be electrically connected to the n-side electrode 44d and the p-side electrode 44e by the conductive bonding agent 45, were respectively 350 µm. Therefore, the dimension of the light-emitting device 40 in X-direction was 1000 µm (1.0 mm), the minimum necessary dimension.

Additionally, in the light-emitting device 40 of the present embodiment also, a plurality of LED chips 44 may be installed on one insulating substrate 47. Further, in the light-emitting device 40 in the present invention also, the light-transmitting resin 46, which is to be placed on the insulating substrate 47, may be formed into various lens shapes at its portions related to the respective LED chips 44, in the same manner as the aforementioned embodiments.

EMBODIMENT 4

Referring to FIG. 12, the following description will discuss still another embodiment of the present invention.

Figure 12A:
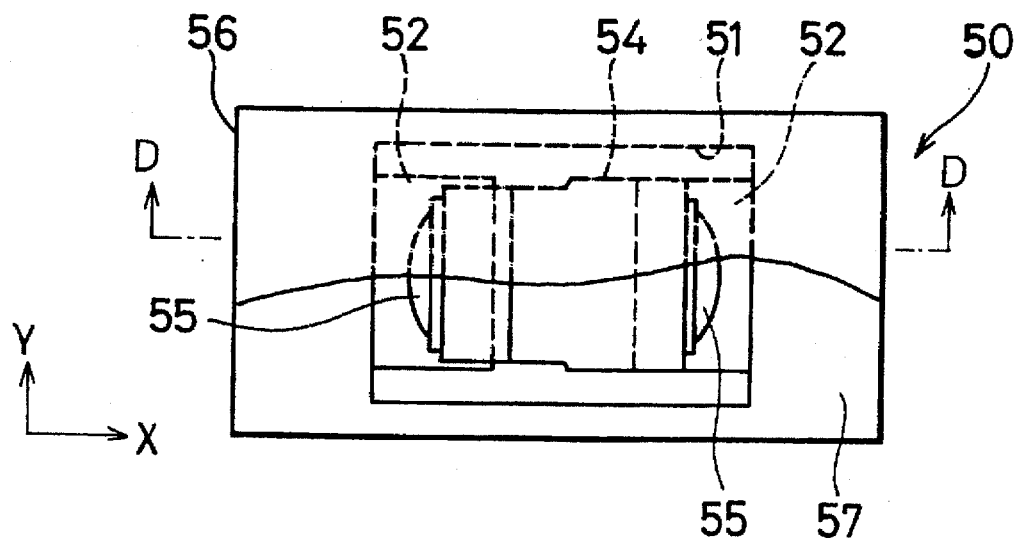
FIG. 12(a) is a plan view showing a light-emitting device in partially exploded manner that relates to still another embodiment of the present invention.
Figure 12B:
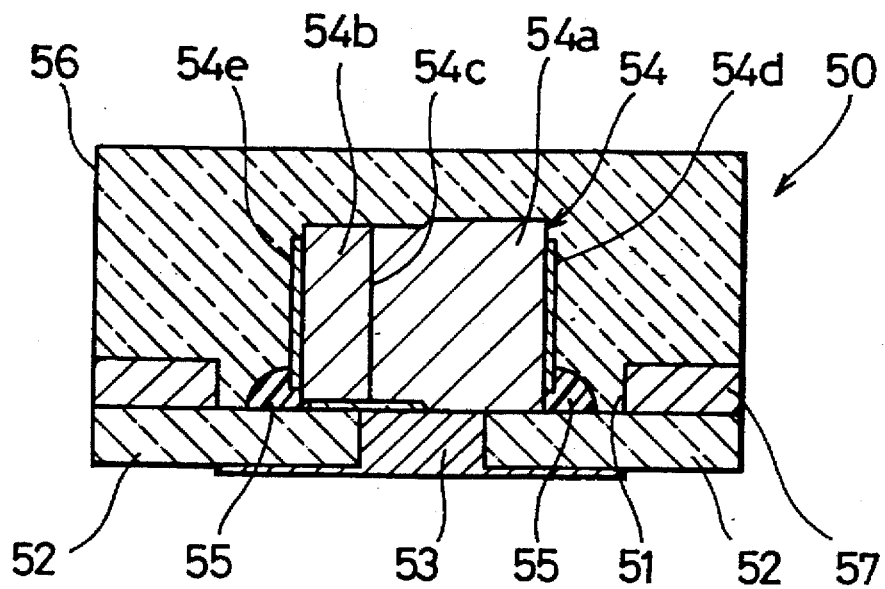
FIG. 12(b) is a cross-sectional view taken along Line D—D of FIG. 12(a).
Figure 13:
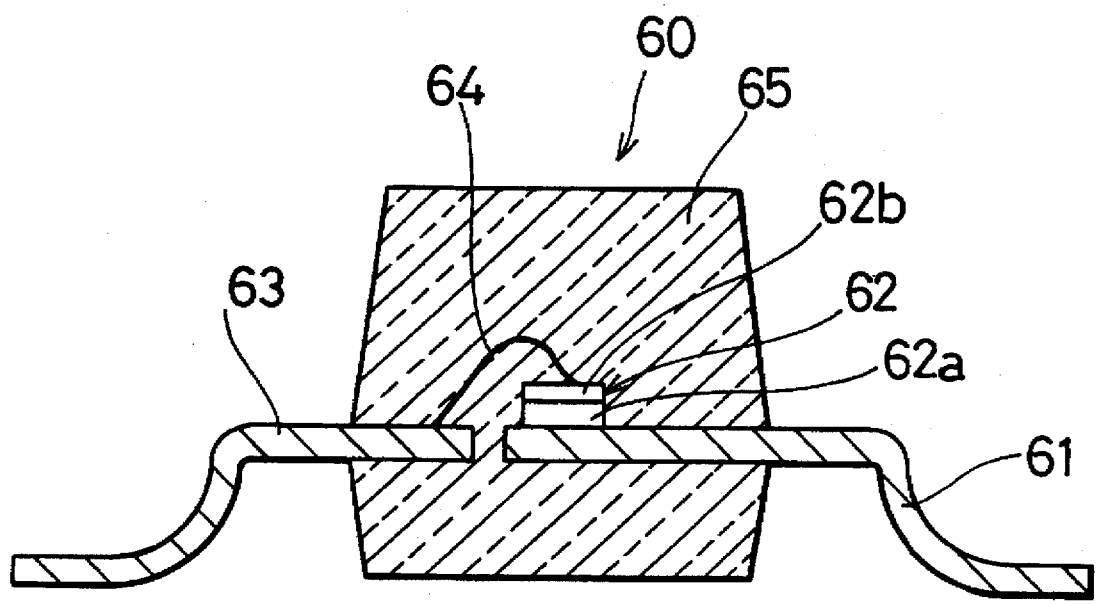
FIG. 13 is a cross-sectional view showing a conventional light-emitting device.
Figure 14:
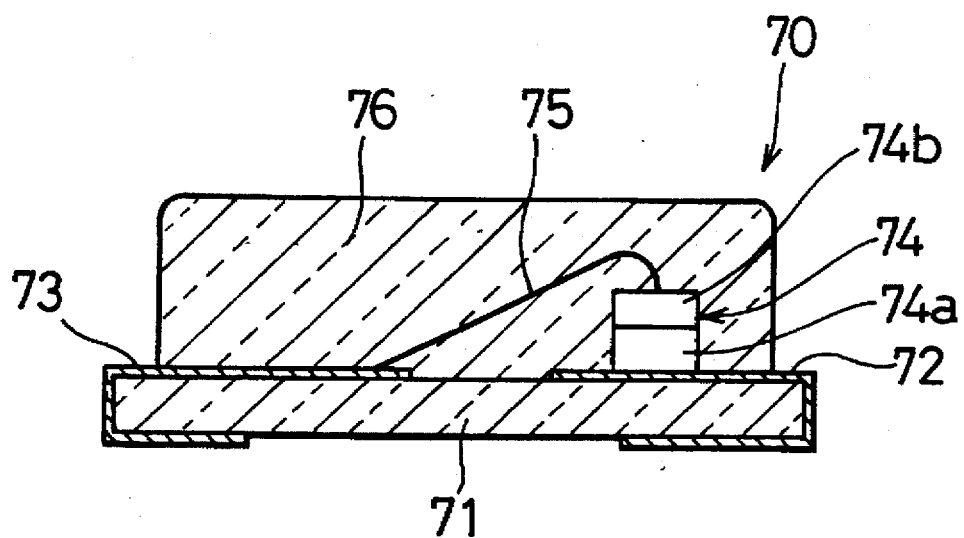
FIG. 14 is a cross-sectional view showing another conventional light-emitting device.
Figure 15:
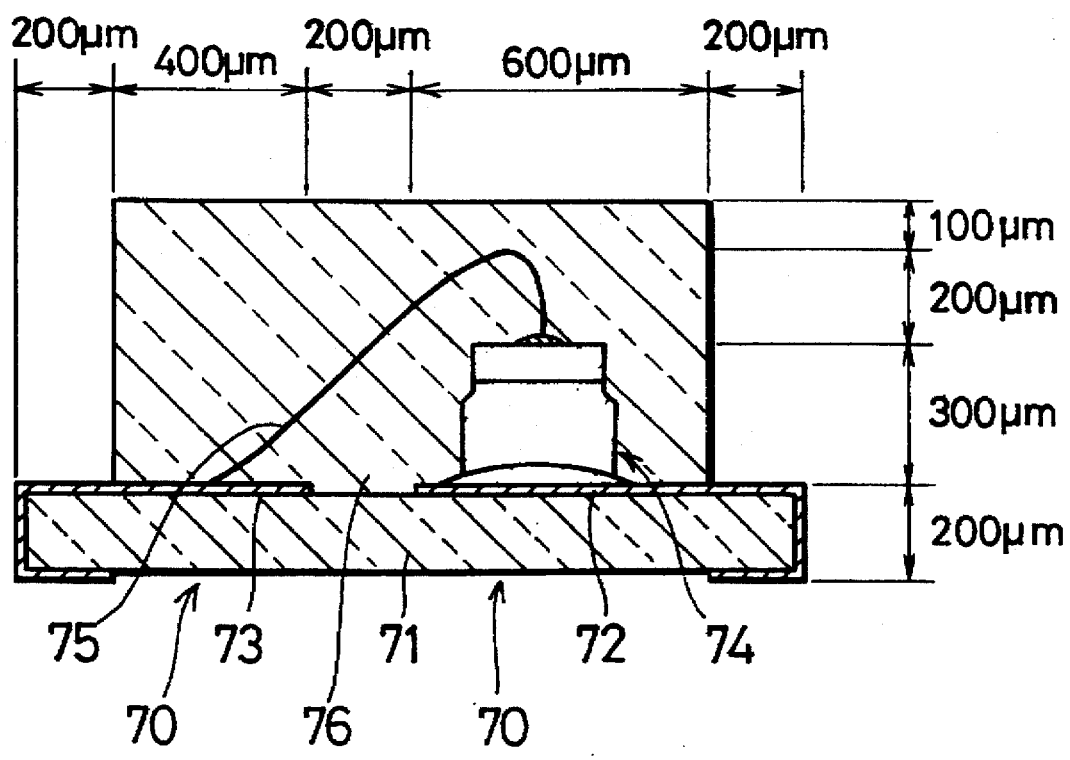
FIG. 15 is a cross-sectional view showing the dimensions of the light-emitting device of FIG. 14.

FIG. 12(a) is a plan view showing a light-emitting device 50 in a partially exploded manner that relates to still another embodiment of the present invention: FIG. 12(b) is a cross-sectional view taken along Line D—D of FIG. 12(a).

In the light-emitting device 50 of the present embodiment, through holes 51, each of which has a rectangular shape, are provided in an insulating substrate 57 made of polyimide, glass epoxy or other insulating materials. Further, a pair of electrode patterns (first and second electrodes) 52, which are made of metal films, are installed on the bottom surface of the insulating substrate 57. The respective electrode patterns 52 are made by stacking metal layers of copper, nickel and gold. The respective ends of the electrode patterns 52 are disposed inside each through hole 51 with a predetermined gap from each other. Further, an LED chip 54 is disposed between the paired electrode patterns 52 that protrude in the through holes 51, in such a manner that it is bridged from one of the electrode patterns 52 to the other electrode pattern 52.

The LED chip 54 also consists of an n-side semiconductor layer 54a and a p-side semiconductor layer 54b that are stacked by a p-as junction, in the same manner as the aforementioned embodiments. Further, an n-side electrode 54d is installed on the surface of the n-side semiconductor layer 54a. Moreover, a p-side electrode 54e is installed on the surface of the p-side semiconductor layer 54b. The LED chip 54 is disposed between the paired electrode patterns 52 in such a bridged state that a surface 54c having the p-n junction, which forms a joined surface between the n-side semiconductor layer 54a and the p-side semiconductor layer 54b, is kept non-parallel to the insulating substrate 57, or more desirably is kept perpendicular thereto. In this case, the n-side electrode 54d and the p-side electrode 54e are respectively placed perpendicularly to the electrode patterns 52.

The electrode patterns 52 are bonded to the n-side electrode 54d and the p-side electrode 54e of the LED chip 54 by using a conductive bonding agent 55, such as solder, Ag paste and Cu paste, so that they are kept conductive to each other.

Resist 53 is used to fill the gap between the electrode patterns 52 that are separated from each other. Thus, the electrode patterns 52 are maintained in an insulated state from each other.

Furthermore, the LED chip 54 and the conductive bonding agent 55 on the insulating substrate 57 are sealed by a light-transmitting resin 56, such as epoxy resin, phenoxy resin, acrylate resin and PES resin. This light-transmitting resin 56 is molded into a rectangular parallelopiped that follows the respective end faces of the insulating substrate 57.

The light-emitting device 50 having the above-mentioned structure is manufactured by the following method: First, through holes 51, each having a rectangular shape that extends in X-direction, that is, in the length-wise direction of the insulating substrate 57, are formed in the insulating substrate 57 that is made of polyimide or other insulating materials, in X-direction as well as in Y-direction that is orthogonal to X-direction, in the form of a matrix.

Next, a metal film is affixed to the entire bottom surface of the insulating substrate 57. Then, unnecessary portions thereof are removed by an etching process so as to form a pair of electrode patterns 52 that are separated from each other inside each through hole 51. Thereafter, the resist 53 is used to fill the gap between the electrode patterns 52 that are separated from each other inside each through hole 51.

Successively, an LED chip 54 is inserted into the through hole 51. The LED chip 54 is bridged between the paired electrode patterns 52 that are separated from each other inside each through hole 51. Moreover, the LED chip 54 is bonded to the respective electrode patterns 52 by conductive bonding agent 55 so that they are kept conductive to each other.

Thereafter, the LED chip 54 is sealed by the light-transmitting resin 56 in the same manner as the aforementioned embodiments. In this case, the through holes 51, provided in the insulating substrate 57, are covered with the electrode patterns 52 and the resist 53 which function as sealing members. This makes it possible to prevent the light-transmitting resin 56 in the molten state from flowing into the through holes 51 and trickling down to the bottom surface of the insulating substrate 57. The resist 53 covers the reverse side of the end portion of each electrode pattern 52, and provides a greater bonding area to the electrode pattern 52. This makes it possible to increase the bonding strength and also to further prevent the light-transmitting resin 56 in the molten state from flowing into the through holes 51 and trickling down to the bottom surface of the insulating substrate 57. As a result, the sealing process using the light-transmitting resin 56 can be readily carried out. Further, it is possible to miniaturize the entire structure of the light-emitting device 50.

Finally, the insulating substrate 57 and the light-transmitting resin 56 are subjected to dicing cuts with respect to each LED chip 54. Thus, the light-emitting device 50, shown in FIG. 12, is obtained.

As described above, the light-emitting device 50 of the present embodiment is manufactured more easily because it is not necessary to form the electrode patterns 52 in a bent fashion on the bottom surface of the insulating substrate 57 through the through holes 51 and also because no plating process is required. Further, since the electrode patterns 52 are formed only on one side of the insulating substrate 57, that is, on the bottom surface thereof, it is possible to cut the manufacturing cost.

Additionally, in the light-emitting device 50 of the present embodiment also, a plurality of LED chips 54 may be installed on one insulating substrate 57. Further, in the light-emitting device 50 in the present invention also, the light-transmitting resin 56, which is to be mounted on the insulating substrate 57, may be formed into various lens shapes at its portions related to the respective LED chips 54, in the same manner as the aforementioned embodiments.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A light-emitting device comprising:
    an insulating substrate having at least one through hole;
    first and second electrodes each having respective ends, the first and second electrodes being provided on a bottom surface of the insulating substrate so that the ends are separated from each other in a through hole; and
    a light-emitting diode chip connected between a first electrode and a second electrode of each through hole of said insulating substrate.

2. The light-emitting device as defined in claim 1, further comprising a sealing member for sealing the through holes.

3. The light-emitting device as in claim 1 wherein the light-emitting diode chip includes a p-side semiconductor layer and a n-side semiconductor layer that are joined into a p-n junction and wherein a surface having the p-n junction is not parallel to the insulating substrate.

* * * * *